(12) United States Patent
Shimizu

(10) Patent No.: US 12,243,582 B2
(45) Date of Patent: Mar. 4, 2025

(54) SEMICONDUCTOR INTEGRATED CIRCUIT

(71) Applicant: LAPIS Technology Co., Ltd., Yokohama (JP)

(72) Inventor: Eikichi Shimizu, Yokohama (JP)

(73) Assignee: LAPIS Technology Co., Ltd., Yokohama (JP)

(*) Notice: Subject to any disclaimer, the term of this patent is extended or adjusted under 35 U.S.C. 154(b) by 43 days.

(21) Appl. No.: 18/190,980

(22) Filed: Mar. 28, 2023

(65) Prior Publication Data

US 2023/0317147 A1    Oct. 5, 2023

(30) Foreign Application Priority Data

Mar. 30, 2022 (JP) ................. 2022-057746

(51) Int. Cl.
| | | |
|---|---|---|
| G11C 11/413 | (2006.01) | |
| G06F 1/3287 | (2019.01) | |
| G06F 1/3293 | (2019.01) | |
| G11C 5/14 | (2006.01) | |
| H10B 10/00 | (2023.01) | |

(52) U.S. Cl.
CPC ........ G11C 11/413 (2013.01); G06F 1/3287 (2013.01); G06F 1/3293 (2013.01); *G11C 5/14* (2013.01); *H10B 10/00* (2023.02)

(58) Field of Classification Search
CPC ....... G11C 11/413; G11C 5/14; G06F 1/3293; G06F 1/3287; H10B 10/00; H01L 27/0207
See application file for complete search history.

(56) References Cited

U.S. PATENT DOCUMENTS

| | | | | |
|---|---|---|---|---|
| 2004/0246787 A1* | 12/2004 | Yamauchi | ............ | G11C 11/412 257/E27.099 |
| 2005/0188233 A1* | 8/2005 | Park | ............ | G06F 1/3296 713/320 |
| 2010/0123515 A1* | 5/2010 | Sasaki | ............ | H03K 19/0016 327/540 |
| 2013/0117626 A1* | 5/2013 | Penzes | ............ | G06F 1/3275 713/300 |
| 2015/0301589 A1* | 10/2015 | Ahn | ............ | G06F 1/3275 711/103 |
| 2016/0179176 A1* | 6/2016 | Kohara | ............ | G06F 1/3243 713/322 |
| 2016/0239060 A1* | 8/2016 | Koob | ............ | G06F 1/3237 |
| 2017/0315747 A1* | 11/2017 | Yang | ............ | G06F 3/0634 |
| 2019/0187770 A1* | 6/2019 | Severino | ............ | G06F 1/3287 |

FOREIGN PATENT DOCUMENTS

JP    2004014663    1/2004

* cited by examiner

*Primary Examiner* — Huan Hoang
*Assistant Examiner* — Justin Bryce Heisterkamp
(74) *Attorney, Agent, or Firm* — JCIPRNET (57) ABSTRACT

A semiconductor integrated circuit includes a first control part included in a first region in which a first operation speed is permitted, a second control part included in a second region in which power supply is cut off in a power saving mode and in which an operation at a speed higher than the first operation speed is required, a functional part having a specific function, and a selection part selecting either a first path connecting the first control part and the functional part or a second path connecting the second control part and the functional part in response to a control signal.

17 Claims, 9 Drawing Sheets

SEMICONDUCTOR INTEGRATED CIRCUIT

CROSS-REFERENCE TO RELATED APPLICATION

This application claims priority under 35 USC 119 from Japanese Patent application No. 2022-057746 filed on Mar. 30, 2022, the disclosure of which is incorporated by reference herein.

BACKGROUND

Technical Field

The disclosure relates to a semiconductor integrated circuit.

Description of Related Art

General-purpose microcomputers are required to operate at high speed, and also required to have low power consumption. A multi-Vt technique and a power cut-off technique are known as techniques for achieving both high-speed operation and low power consumption. In the multi-Vt method, a threshold voltage of an element constituting a circuit block requiring high-speed operation is set to be lower than a threshold voltage of an element constituting a circuit block allowing low-speed operation, thereby reducing a leakage current. On the other hand, in the power cut-off technique, the power supply to an unnecessary circuit block is cut off at the time of transitioning to a power saving mode.

For example, Japanese Patent Laid-Open No. 2004-14663 discloses a semiconductor integrated circuit that includes a first region to which the supply of power is cut off during a standby state and a second region to which power is supplied constantly. In the first region, a first logic circuit such as a digital signal processor (DSP), which requires high-speed processing operation, and a first SRAM are disposed. On the other hand, in the second region, a second logic circuit such as a central processing unit (CPU) and a second SRAM are disposed. Then, a threshold voltage of an element of a circuit block in the first region, to which the supply of power is cut off during a standby state, is set to be lower than threshold voltages of elements of other circuit blocks, thereby reducing a leakage current.

However, in such a circuit configuration of the related art, a low-speed SRAM and a high-speed SRAM are required, resulting in a problem that a chip size and a chip cost increase. This problem occurs not only when an SRAM is accessed, but also when a specific functional part is accessed by a plurality of control blocks with different operation speeds.

SUMMARY

The disclosure provides a semiconductor integrated circuit in which a plurality of control parts having different operation speeds can share a specific functional part, and a chip size can be reduced.

A semiconductor integrated circuit of the disclosure includes a first control part included in a first region in which a first operation speed is permitted, a second control part included in a second region in which power supply is cut off in a power saving mode and in which operation at a speed higher than the first operation speed is required, a functional part having a specific function, and a selection part selecting either a first path connecting the first control part and the functional part or a second path connecting the second control part and the functional part in response to a control signal.

According to a semiconductor integrated circuit of the disclosure, a plurality of control parts having different operation speeds can share a specific functional part, and a chip size can be reduced.

DESCRIPTION OF THE EMBODIMENTS

An example of an embodiment of the disclosure will be described in detail below with reference to the drawings.

<Basic Configuration>

First, a basic configuration of the disclosure will be described with reference to FIG. 1.

A semiconductor integrated circuit according to the basic configuration includes a first control part 102 included in a first region 100 in which operation at a normal speed is permitted, a second control part 106 included in a second region 104 in which faster operation is required compared to the first operation speed, a functional part 108 having a specific function, and a selection part 110 that selects any one of a first path connecting the first control part 102 and the functional part 108 in response to a control signal and a second path connecting the second control part 106 and the functional part 108.

The normal speed is a general-purpose processing speed. Hereinafter, operation that is faster than the normal speed will be referred to as "high-speed operation," and operation at the normal speed will be referred to as "low-speed operation" or "power-saving operation."

The first control part 102 is a data transfer device such as a DMA controller (DMAC). The second control part 106 is a processor such as a central processing unit (CPU) or a digital signal processor (DSP). The selection part 110 can be constituted by an arbitration circuit, a multiplexer, or the like functioning as a selector.

The functional part 108 is mainly assumed to be a memory, but may be any of various computation units, a communication interface, or the like. Examples of the memory include a static random access memory (SRAM), a magnetoresistive random access memory (MRAM), a flash memory (FLASH), a ferroelectric random access memory (FeRAM), and the like. Examples of the computation part include a random number generator, a sensing circuit such as a low voltage detection circuit, and the like. Examples of the communication interface include a serial peripheral interface (SPI), a universal asynchronous receiver/transmitter (UART), I2C, and the like.

According to the multi-Vt technique, a threshold voltage of an element included in the second region 104 is set to be lower than a threshold voltage of an element included in the first region 100. Lowering a threshold current increase an operation speed, but also increases a leakage current. Hereinafter, a higher threshold voltage will be referred to as a "high threshold voltage," and a lower threshold voltage will be referred to as a "low threshold voltage."

The functional part 108 and the selection part 110 may be constituted by either an element having a high threshold voltage or an element having a low threshold voltage. In general, the functional part 108 such as an SRAM is expected to operate at a high speed, and thus the functional part 108 is constituted by an element having a low threshold voltage. The selection part 110 such as a multiplexer is allowed to operate at low speed, and is thus constituted by an element having a high threshold voltage. However, it is only required that the functional part 108 and the selection part 110 be able to cope with a desired operation speed, and the types of elements that constitute the functional part 108 and the selection part 110 can be appropriately changed depending on a desired power saving effect and a desired operation speed.

Next, operation of the semiconductor integrated circuit illustrated in FIG. 1 will be described.

The semiconductor integrated circuit operates in a normal mode in which power is supplied to the entire circuit, or in a power saving mode in which the power supply to a portion of the circuit is cut off. In a basic configuration, only the second region 104 is subjected to power cut-off.

In the normal mode, power is supplied to the entire circuit including both the second region 104 and the first region 100. At this time, the selection part 110 selects the second path to enable the second control part 106 to access the functional part 108. In the power saving mode, power is supplied to the first region 100, but the power supply to the second region 104, which has a large leakage current, is cut off. At this time, the selection part 110 selects the first path to enable the first control part 102 to access the functional part 108.

In the normal mode, the selection part 110 may appropriately switch between the selection of the first route and the selection of the second route to enable the first control part 102 to access the functional part 108.

Figure 1:
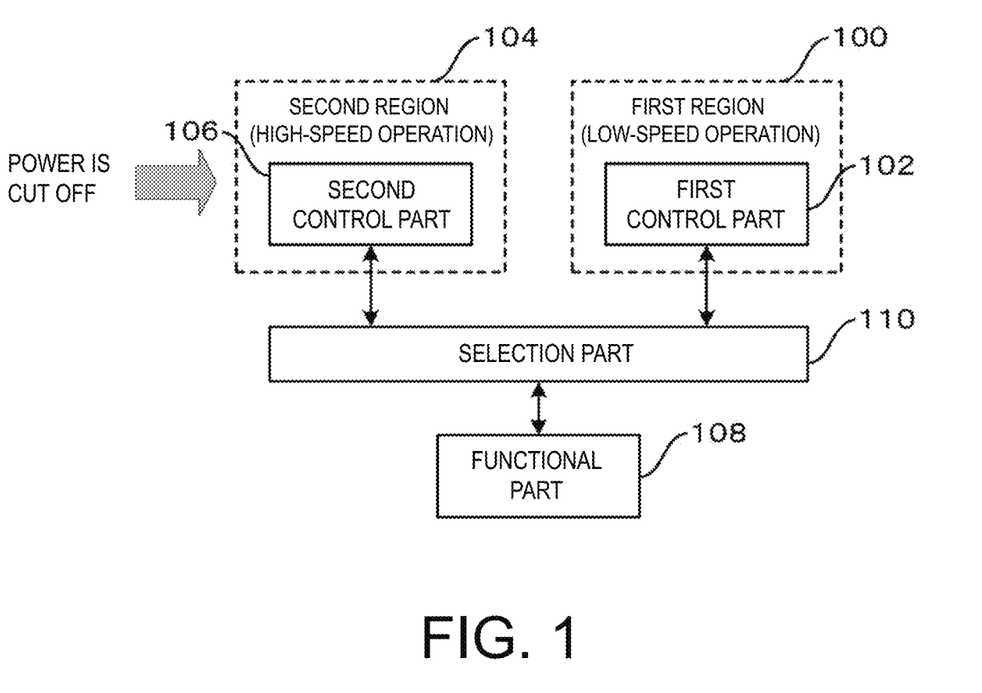
FIG. 1 is a schematic diagram illustrating an example of a basic configuration of the disclosure.

In the basic configuration illustrated in FIG. 1, the functional part 108 and the selection part 110 may be disposed outside the first region 100. However, the following modification examples are conceivable according to in which region the functional part 108 and the selection part 110 are disposed and by what kind of element the functional part 108 and the selection part 110 are constituted.

First Modification Example of Basic Configuration

Figure 2:
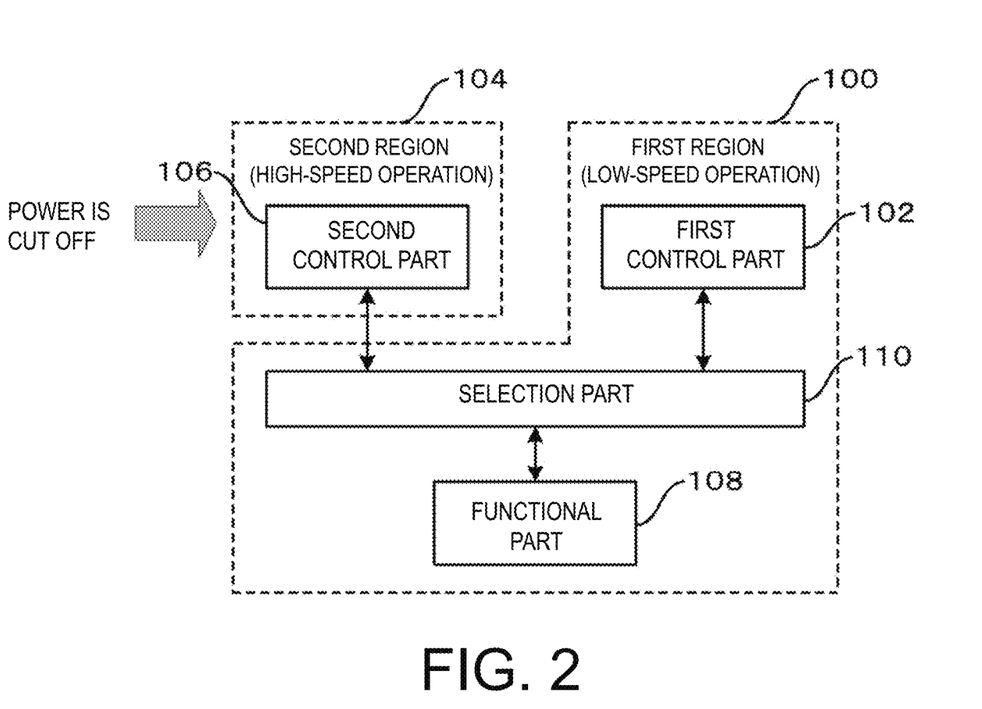
FIG. 2 is a schematic diagram illustrating a first modification example of the basic configuration illustrated in FIG. 1.

In a first modification example, as illustrated in FIG. 2, the functional part 108 and the selection part 110 are disposed in the first region 100. Similarly to the basic configuration illustrated in FIG. 1, only the second region 104 is subjected to power cut-off. Thus, power is constantly supplied to the functional part 108 and the selection part 110.

Second Modification Example of Basic Configuration

Figure 3:
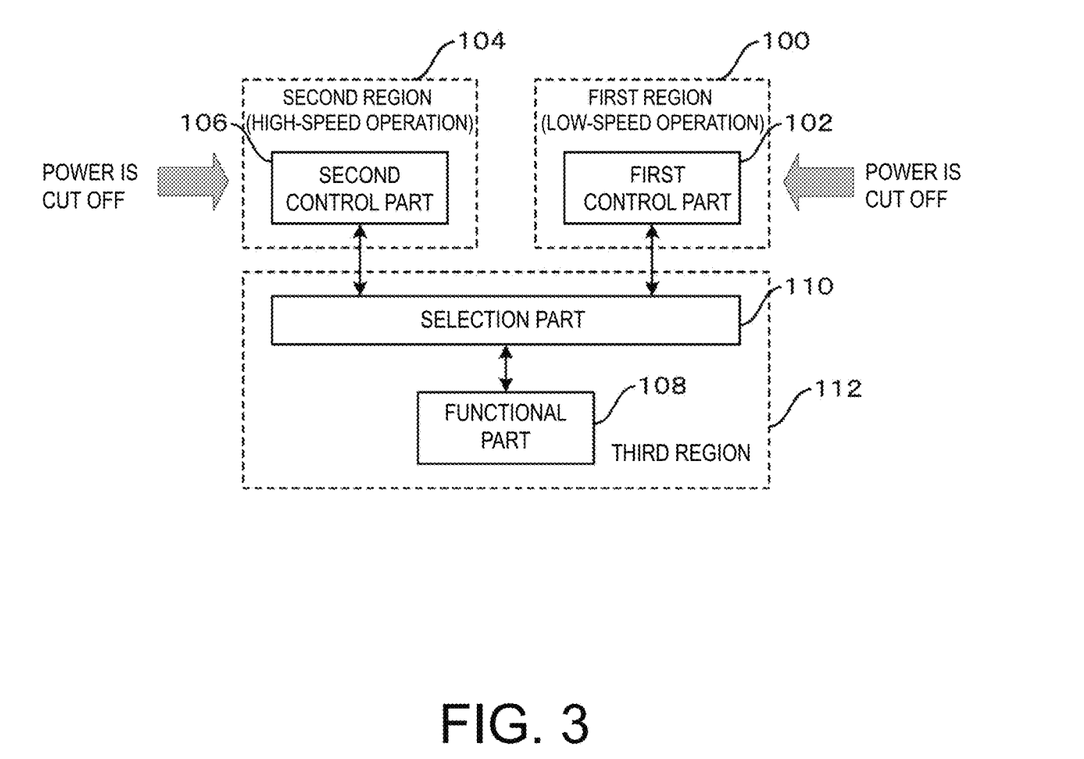
FIG. 3 is a schematic diagram illustrating a second modification example of the basic configuration illustrated in FIG. 1.

In a second modification example, as illustrated in FIG. 3, the functional part 108 and the selection part 110 are disposed in a third region 112 different from both the first region 100 and the second region 104. In this example, power is constantly supplied to the third region 112, that is, the functional part 108 and the selection part 110. On the other hand, both the first region 100 and the second region 104 are subjected to power cut-off. For example, while the second control part 106 is accessing the functional part 108, the power supply to the first region 100 is cut off.

Hereinafter, a specific embodiment of a semiconductor integrated circuit including a "DMAC" as the first control part 102, including a "CPU" as the second control part 106, and including an "analog-to-digital converter (ADC)" and an "ADC controller" as the functional part 108 will be described.

First Embodiment

A configuration of a semiconductor integrated circuit according to a first embodiment will be described with reference to FIG. 4.

The semiconductor integrated circuit includes a first region 12 in which a low-speed operation is permitted, a second region 14 in which a high-speed operation is required, and a power switch 16 that turns on and turns off a power supply (VDD) supplying power to the second region 14. Power is constantly supplied to the first region 12.

In the first region 12, a DMAC 32, an SRAM/AHB bridge 34, an ADC controller 36, an ADC 38, an advanced high-performance bus (AHB) bus 40, an SRAM 50, a multiplexer 52, and a phasor measurement unit (PMU) 54 are disposed. Each of the blocks, except for the ADC 38, the SRAM 50, and the multiplexer 52, is constituted by an element having a high threshold voltage and is capable of a power saving operation. Thus, the AHB bus 40 functions as a low-speed bus.

In the second region 14, a CPU 20, a FLASH/AHB bridge 22, an SRAM/AHB bridge 24, a peripheral 26, a FLASH 28, and an AHB bus 30 are disposed. Each of the blocks, except of the FLASH 28, is constituted by an element having a low threshold voltage and is capable of a high-speed operation. Thus, the AHB bus 30 functions as a high-speed bus.

The CPU 20 and the peripheral 26 are connected to the AHB bus 30. The FLASH 28 is connected to the AHB bus 30 via the FLASH/AHB bridge 22. The AHB bus 40, which is a low-speed bus, is also connected to the AHB bus 30 which is a high-speed bus. The DMAC 32 is also connected to the AHB bus 40. The ADC 38 is connected to the AHB bus 40 via the ADC controller 36.

The SRAM 50 is connected to the AHB bus 30 via the multiplexer 52 and the SRAM/AHB bridge 24 and is connected to the AHB bus 40 via the multiplexer 52 and the SRAM/AHB bridge 34. The PMU 54 is connected to each of the power switch 16 and the multiplexer 52 and controls each of the power switch 16 and the multiplexer 52. Although not illustrated in the drawing, the PMU 54 is also communicably connected to the CPU 20.

Each of the FLASH 28, the ADC 38, the SRAM 50, and the multiplexer 52 is only required to cope with a desired operation speed, and the types of elements that constitute them can be appropriately changed depending on a desired power saving effect and a desired operation speed. However, it is preferable that the multiplexer 52 be constituted by an element having a high threshold voltage and be capable of a power saving operation.

In the first embodiment, the semiconductor integrated circuit operates in two modes: a "normal mode" in which power is supplied to the entire circuit, and a "power saving mode" in which the power supply to the second region 14, which is a high-speed operation region, is cut off. The PMU 54 inputs a control signal to the multiplexer 52 in accordance with an operation mode. The multiplexer 52 selects a second path connecting the CPU 20 and the SRAM 50 in the normal mode and selects a first path connecting the DMAC 32 and the SRAM 50 in the power saving mode in response to the control signal.

(Flow of Power Cut-Off in High-Speed Region and Flow of Startup)

Next, operations of the semiconductor integrated circuit will be described.

As a basic operation, in this semiconductor integrated circuit, the ADC 38 periodically performs sampling, and when a certain amount of data is accumulated in the ADC 38, the data is transferred to the SRAM 50 by using the DMAC 32. When a certain amount of data is accumulated in the SRAM 50, the CPU 20 is started up and processes the data in the SRAM 50.

Figure 5:
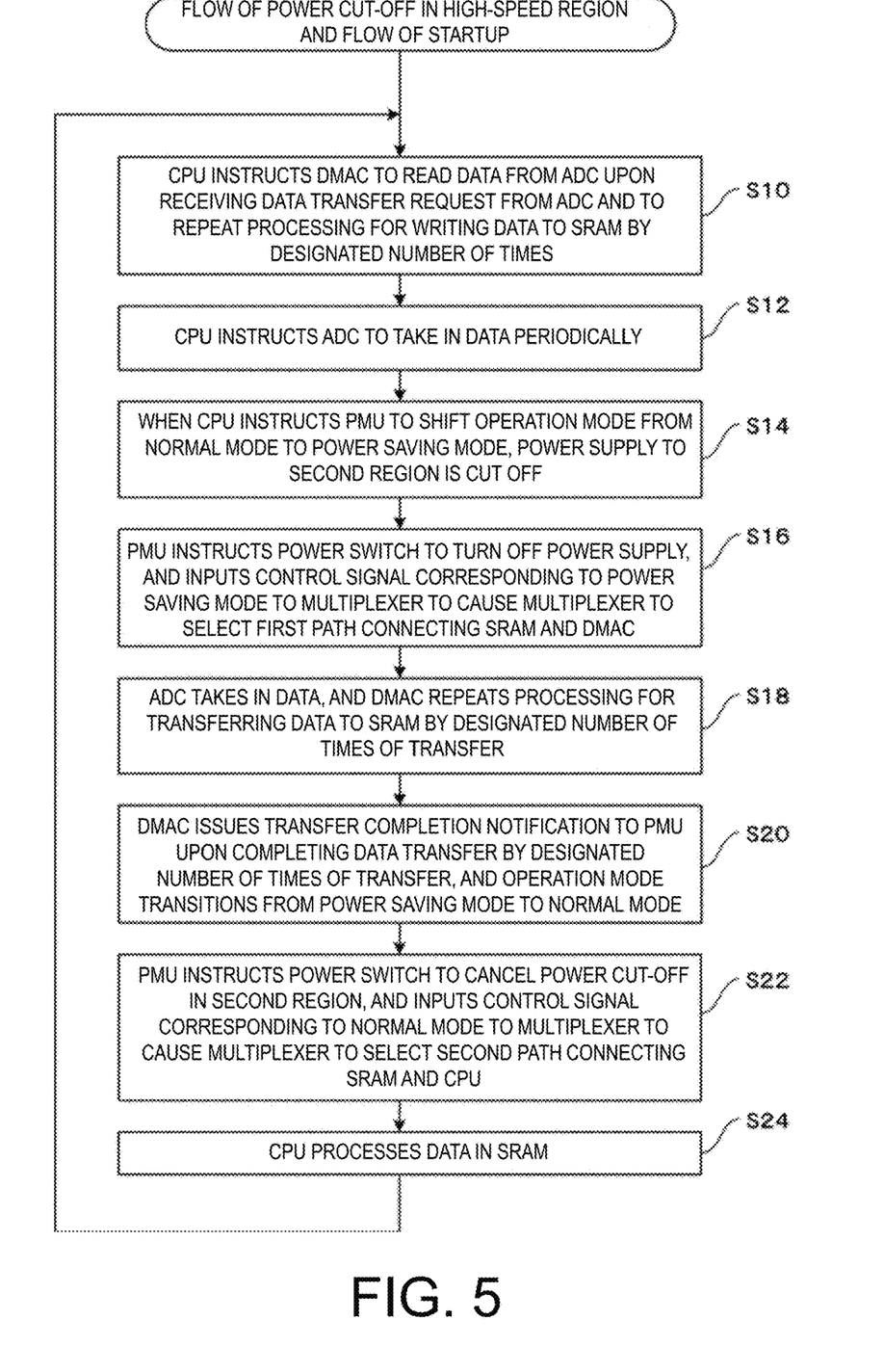
FIG. 5 is a flowchart illustrating an example of operations of the semiconductor integrated circuit according to the first embodiment.

Here, referring to FIG. 5, the above-described procedure will be described in more detail in relation to power cut-off.

First, in step S10, the CPU 20 instructs the DMAC 32 to read data from the ADC 38 upon receiving a data transfer request from the ADC 38 and to repeat processing for writing data to the SRAM 50 by a designated number of times.

Next, in step S12, the CPU 20 instructs the ADC 38 to take in the data periodically.

Next, in step S14, when the CPU 20 instructs the PMU 54 to shift the operation mode from the normal mode to the power saving mode, the power supply to the second region 14 is cut off.

Next, in step S16, the PMU 54 instructs the power switch 16 to turn off the power supply, and inputs a control signal corresponding to the power saving mode to the multiplexer 52 to cause the multiplexer 52 to select the first path connecting the SRAM 50 and the DMAC 32.

Next, in step S18, the ADC 38 takes in the data, and the DMAC 32 repeats the processing for transferring the data to the SRAM 50 by a designated number of times of transfer.

Next, in step S20, the DMAC 32 issues a transfer completion notification to the PMU 54 upon completing data transfer by a designated number of times of transfer. Thereby, the operation mode transitions from the power saving mode to the normal mode.

Next, in step S22, the PMU 54 instructs the power switch 16 to cancel the power cut-off in the second region 14, and inputs a control signal corresponding to the normal mode to the multiplexer 52 to cause the multiplexer 52 to select the second path connecting the SRAM 50 and the CPU 20.

Next, in step S24, the CPU 20 processes the data in the SRAM 50 and returns to step S10 to repeat the operations of steps S10 to S24.

Effects

In the circuit according to the first embodiment, power is supplied to the entire circuit while the CPU 20 is processing the data in the SRAM 50, and the power supply to the second region 14, which is a high-speed operation region, is cut off during the transfer of data from the DMAC 32 to the SRAM 50, thereby making it possible to achieve both a high-speed operation and low power consumption. It is possible to enable a high-speed operation by constituting the second region 14, which is a high-speed operation region, by an element having a low threshold voltage, and it is possible to reduce a leakage current and power consumption by constituting the first region 12, which is a low-speed operation region, by an element having a high threshold voltage.

Next, effects of the first embodiment will be described while comparing with a configuration of the related art.

Figure 10:
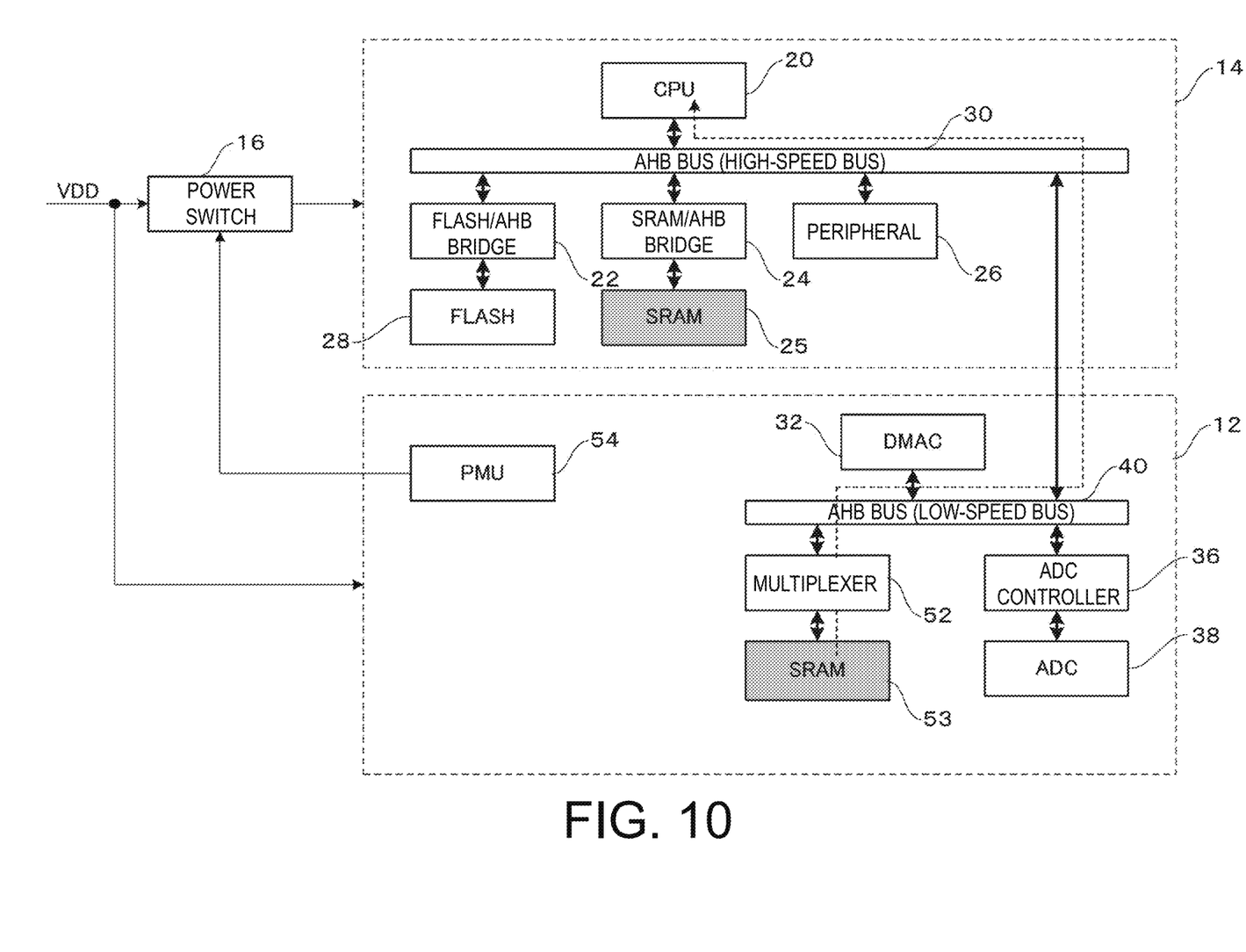
FIG. 10 is a block diagram illustrating a configuration of a semiconductor integrated circuit of the related art which uses both a multi-Vt technique and a power cut-off technique.

FIG. 10 illustrates a configuration of a semiconductor integrated circuit of the related art which uses both a multi-Vt technique and a power cut-off technique. The same components as those of the semiconductor integrated circuit illustrated in FIG. 4 are denoted by the same reference numerals and signs. In the semiconductor integrated circuit of the related art, an SRAM 25 for a high-speed operation which is used by a CPU 20 is provided in a second region 14, and an SRAM 53 for a low-speed operation is provided in a first region 12 as well.

Compared to a circuit configuration of the related art, in the semiconductor integrated circuit according to the first embodiment, the SRAM 50 is used in common for a high-speed operation and a low-speed operation, thereby reducing a chip size and a chip cost as compared to the circuit configuration of the related art.

As illustrated in FIG. 10, in the circuit configuration of the related art, when the CPU 20 processes data in the SRAM 53 for a low-speed operation, the data needs to pass through an AHB bus 40, which is a low-speed bus, and can be processed only at low speed, as indicated by a dashed line. For this reason, the processing time of the CPU 20 is lengthened, and power consumption is increased. On the other hand, in the semiconductor integrated circuit according to the first embodiment, the CPU 20 can directly process the data in the SRAM 50 without going through the low-speed bus, and thus a high-speed operation is possible, and a processing time is short, thereby making it possible to reduce power consumption.

Here, a modification example of the configuration of the semiconductor integrated circuit illustrated in FIG. 4 will be described.

(Omission of Bridge Circuit)

Figure 4:
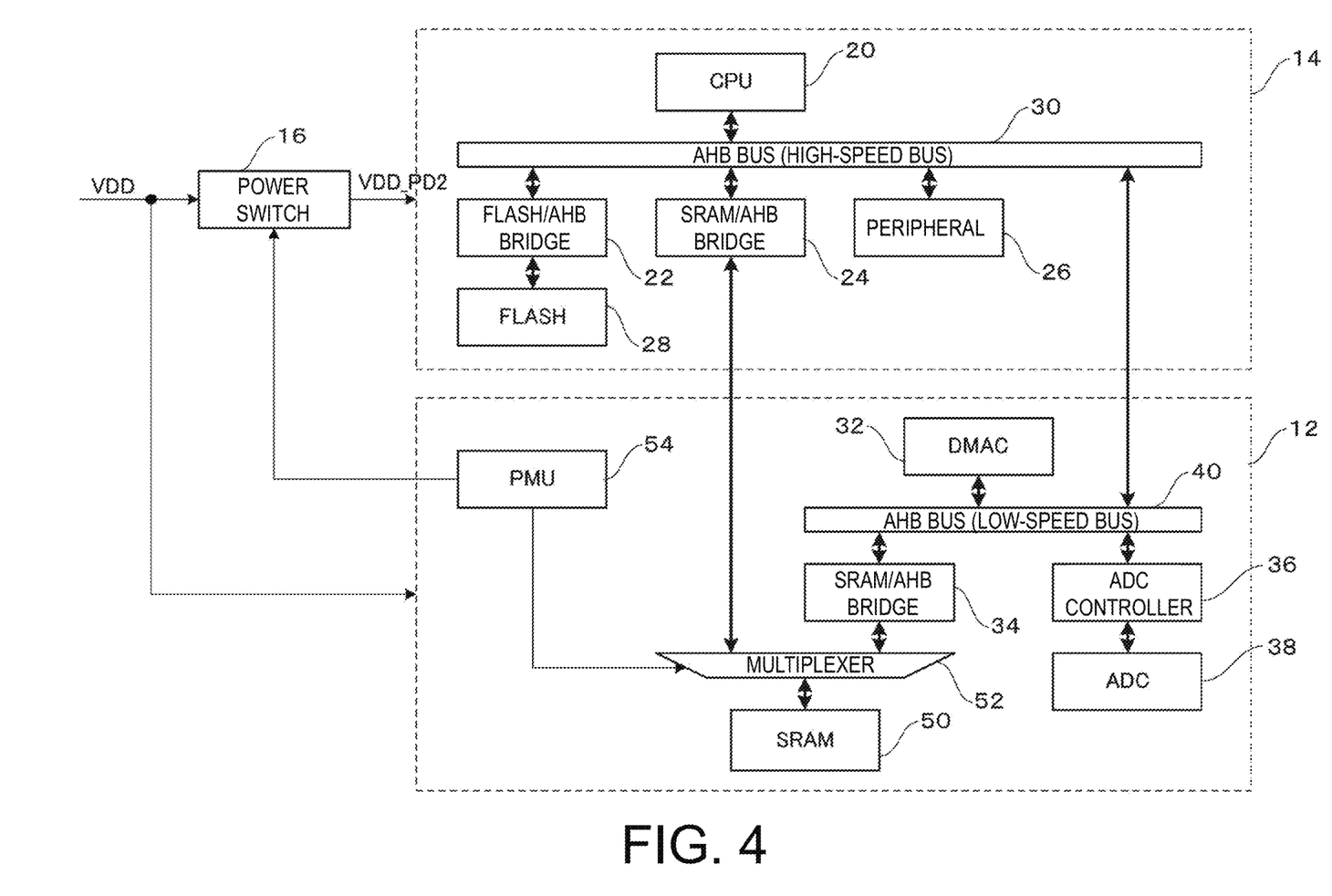
FIG. 4 is a block diagram illustrating an example of a configuration of a semiconductor integrated circuit according to a first embodiment of the disclosure.
Figure 6:
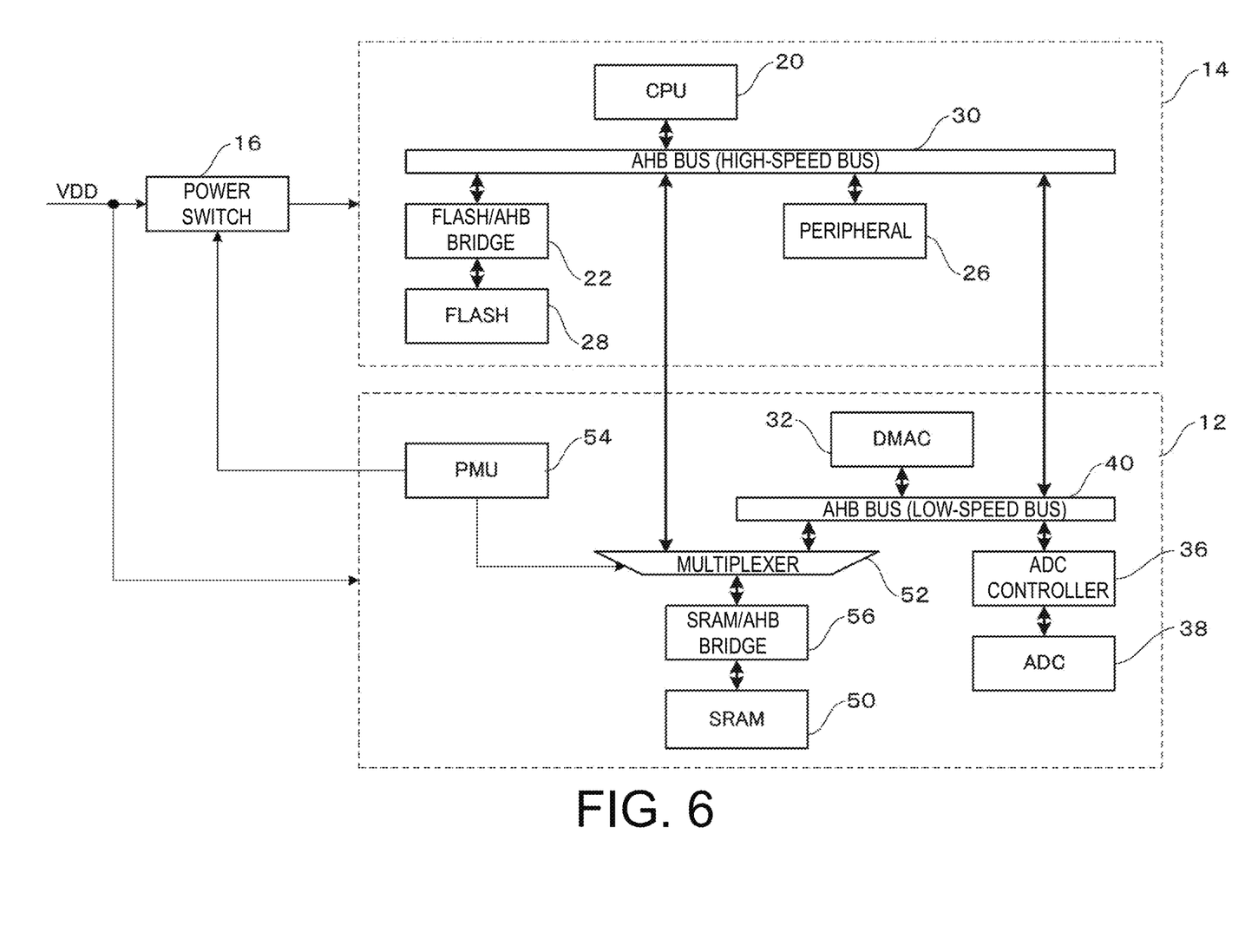
FIG. 6 is a block diagram illustrating a modification example of the configuration of the semiconductor integrated circuit illustrated in FIG. 4.

In the circuit configuration illustrated in FIG. 4, the SRAM/AHB bridge 24 is provided in the second region 14, and the SRAM/AHB bridge 34 is provided in the first region 12 as well. On the other hand, in the example illustrated in FIG. 6, a common SRAM/AHB bridge 56 is disposed between the SRAM 50 and the multiplexer 52, and the multiplexer 52 is connected to each of the AHB bus 30 and the AHB bus 40. By disposing the common SRAM/AHB bridge 56, one SRAM/AHB bridge can be omitted.

(Use of Arbitration Circuit)

In the circuit configuration illustrated in FIG. 4, the multiplexer 52 is used as a selection part (see the selection part 110 in FIG. 1). The multiplexer 52 has advantages of a small number of logic stages and a relatively high processing speed. However, since the multiplexer 52 switches a path according to an operation mode, the second path is selected in the normal mode, and the multiplexer 52 cannot access the SRAM 50 from the first path regardless of power being supplied to the first region 12.

Figure 7:
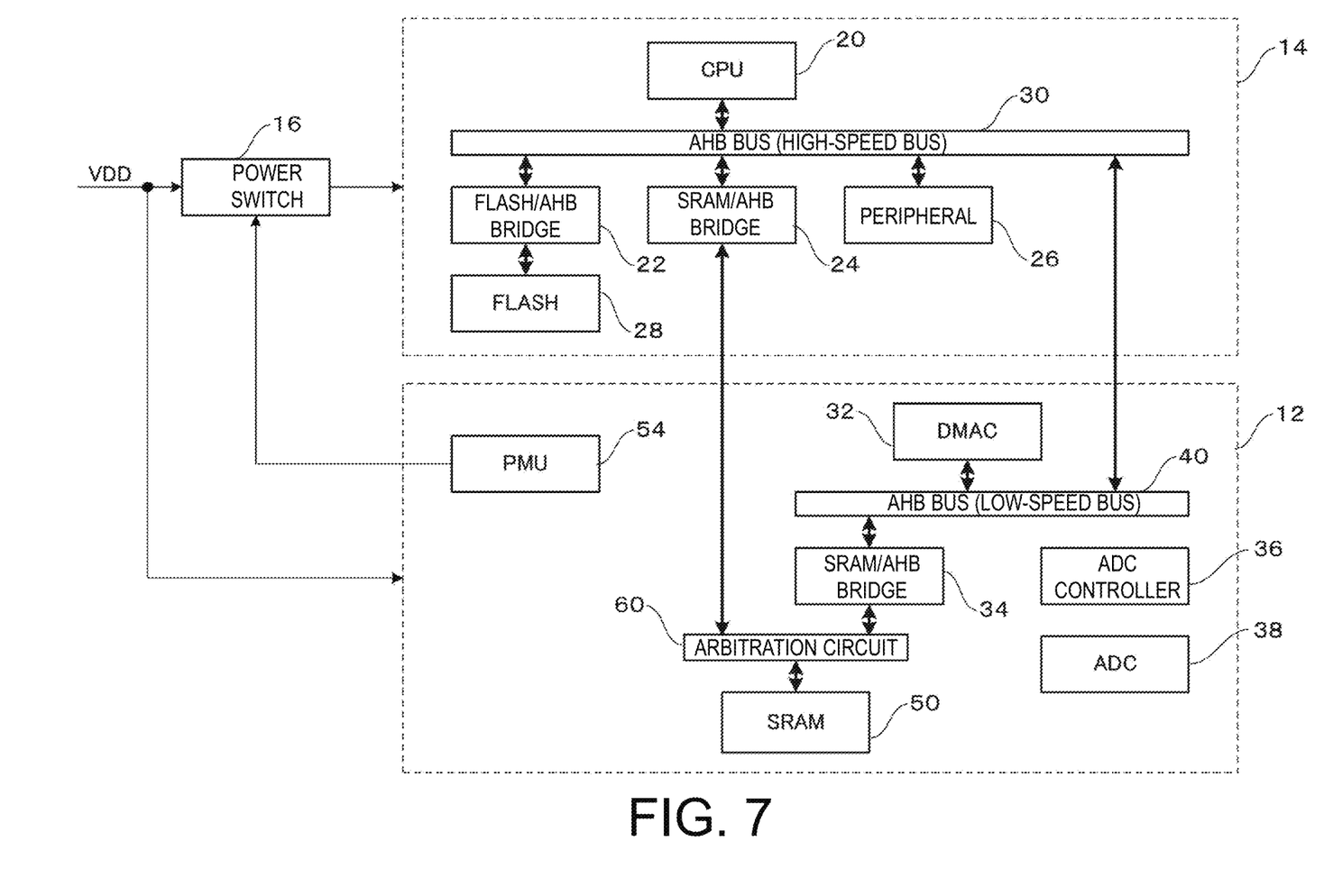
FIG. 7 is a block diagram illustrating a modification example of the configuration of the semiconductor integrated circuit illustrated in FIG. 4.

On the other hand, in the example illustrated in FIG. 7, the arbitration circuit 60 is used as a selection part. The arbitration circuit 60 can receive an access notification from each of the AHB bus 30 and the AHB bus 40, and selects connection to the AHB bus that has received the access notification. In the case of access from the CPU 20, access is notified from the AHB bus 30, and in the case of access from the DMAC 32, access is notified from the AHB bus 40. Thus, in a case where the arbitration circuit 60 is provided, it is possible to select the first path even in the normal mode. In this case, since the selection is made based on the access notification from the AHB bus, a control signal does not need to be input from the PMU 54.

Second Embodiment

Figure 8:
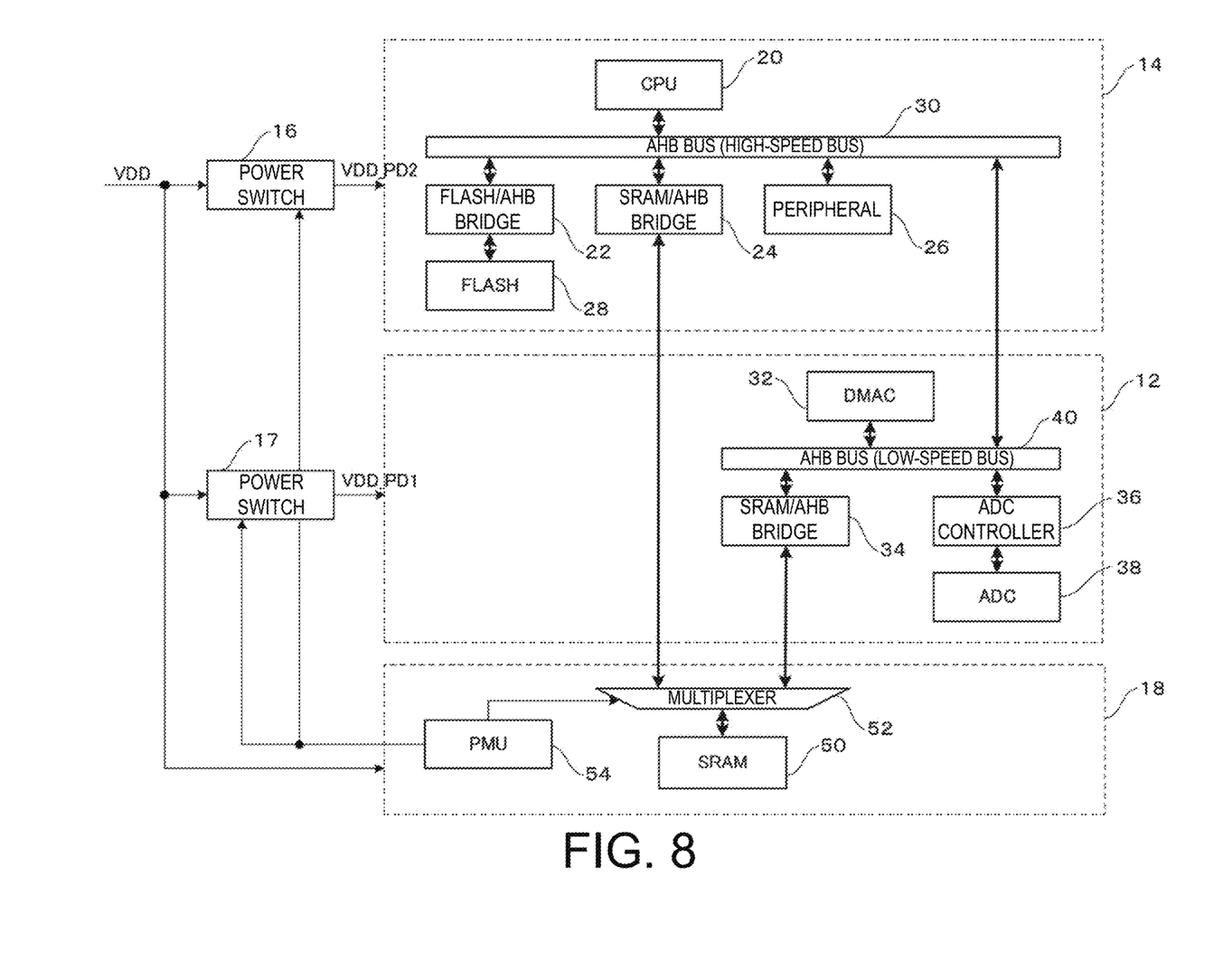
FIG. 8 is a block diagram illustrating an example of a configuration of a semiconductor integrated circuit according to a second embodiment of the disclosure.

As illustrated in FIG. 8, since a semiconductor integrated circuit according to a second embodiment has the same configuration as the semiconductor integrated circuit according to the first embodiment except that an SRAM 50, a multiplexer 52, and a PMU 54 are removed from a first region 12 and are disposed in a third region 18 different from either the first region 12 or a second region 14, power is constantly supplied to the third region 18, and a power switch 17 that turns on and turns off a power supply supplying power to the first region 12 is added, the same components are denoted by the same reference numerals and signs, and the description thereof will be omitted.

Since power is constantly supplied to the third region 18, the PMU 54 included in the third region 18 is constituted by an element having a high threshold voltage. Each of the SRAM 50 and the multiplexer 52 is only required to cope with a desired operation speed, and the types of elements that constitute them can be appropriately changed depending on a desired power saving effect and a desired operation speed. However, it is preferable that the multiplexer 52 be constituted by an element having a high threshold voltage and is capable of a power saving operation.

In the second embodiment, the semiconductor integrated circuit operates in three modes: a "normal mode" in which power is supplied to the entire circuit, a "first power saving mode" in which the power supply to the second region 14, which is a high-speed operation region, is cut off, and a "second power saving mode" in which the power supply to the first region 12, which is a low-speed operation region, is cut off. The multiplexer 52 selects a second path connecting the SRAM 50 and a CPU 20 in the normal mode and the second power saving mode, and selects a first path connecting the SRAM 50 and a DMAC 32 in the first power saving mode.

Figure 9:
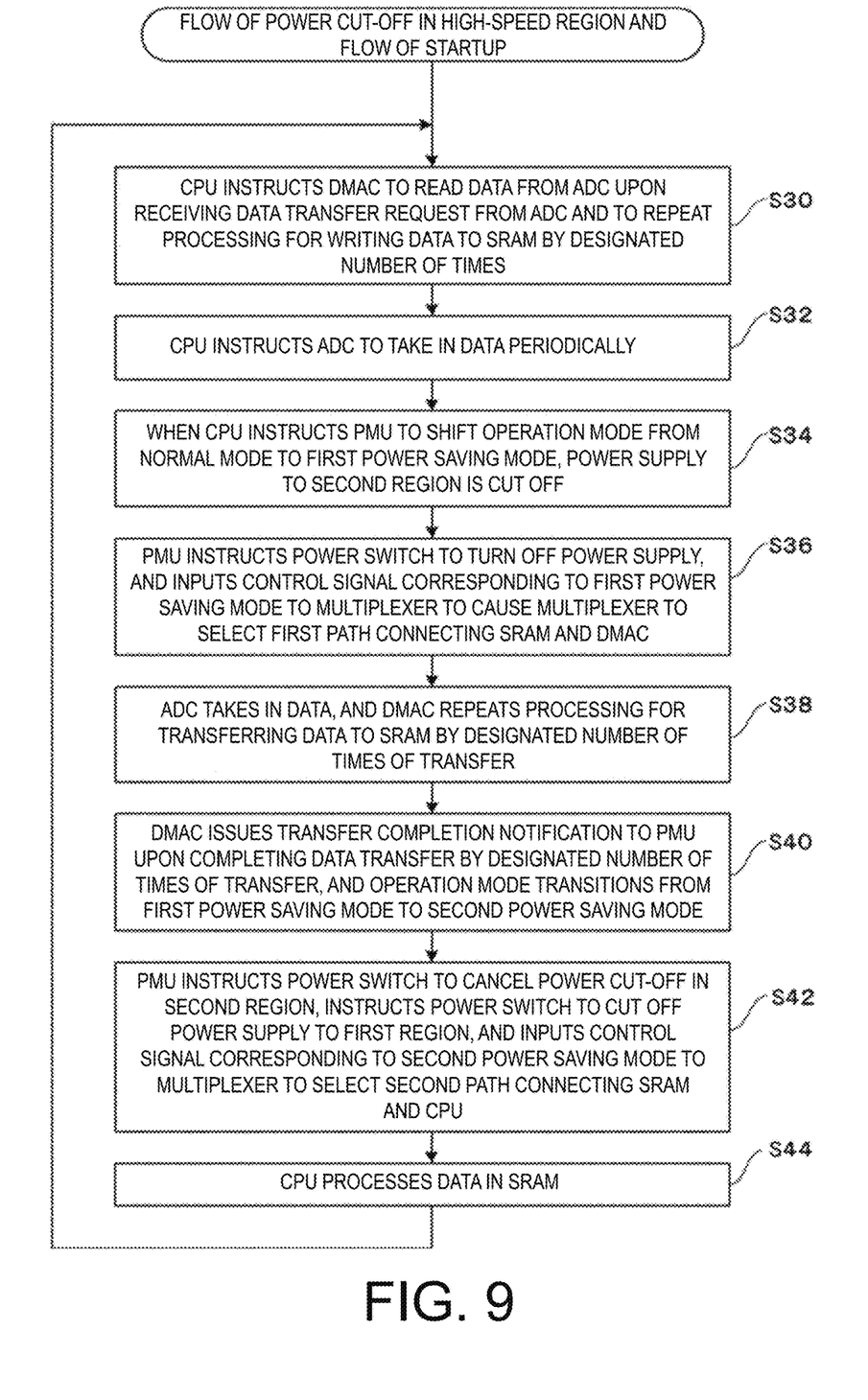
FIG. 9 is a flowchart illustrating an example of operations of the semiconductor integrated circuit according to the second embodiment.

Operations of the semiconductor integrated circuit according to the second embodiment will be described below with reference to FIG. 9. The operations are different from the operations illustrated in FIG. 5 in terms of an operation mode and a target to be subjected to power cut-off.

First, in step S30, the CPU 20 instructs the DMAC 32 to read data from an ADC 38 upon receiving a data transfer request from the ADC 38 and to repeat processing for writing data to the SRAM 50 by a designated number of times.

Next, in step S32, the CPU 20 instructs the ADC 38 to take in the data periodically.

Next, in step S34, when the CPU 20 instructs the PMU 54 to shift the operation mode from the normal mode to the first power saving mode, the power supply to the second region 14 is cut off.

Next, in step S36, the PMU 54 instructs a power switch 16 to turn off the power supply, and inputs a control signal corresponding to the first power saving mode to the multiplexer 52 to cause the multiplexer 52 to select the first path connecting the SRAM 50 and the DMAC 32.

Next, in step S38, the ADC 38 takes in the data, and the DMAC 32 repeats the processing for transferring the data to the SRAM 50 by a designated number of times of transfer.

Next, in step S40, the DMAC 32 issues a transfer completion notification to the PMU 54 upon completing data transfer by a designated number of times of transfer. Thereby, the operation mode transitions from the first power saving mode to the second power saving mode.

Next, in step S42, the PMU 54 instructs the power switch 16 to cancel the power cut-off in the second region 14, instructs the power switch 17 to cut off the power supply to the first region 12, and inputs a control signal corresponding to the second power saving mode to the multiplexer 52 to select the second path connecting the SRAM 50 and the CPU 20.

Next, in step S44, the CPU 20 processes the data in the SRAM 50 and, returns to step S30 to repeat the operations of steps S30 to S44.

In the second embodiment, in addition to obtaining the same effects as in the first embodiment, the power supply to the first region 12 can also be cut off in the second power saving mode, and thus it is possible to further reduce the overall power consumption.

The second embodiment is similar to the first embodiment in that one bridge circuit can be omitted, and an arbitration circuit can be used in place of the multiplexer.

Modification Example

The configuration of the semiconductor integrated circuit described in the above embodiment is an example, and it is needless to say that the configuration may be changed without departing from the gist of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor integrated circuit comprising:
   a first control part included in a first region in which a first operation speed is permitted;
   a second control part included in a second region in which power supply is cut off in a power saving mode and in which operation at a speed higher than the first operation speed is required;
   a memory having a specific function; and
   a selection part selecting either a first path connecting the first control part and the memory or a second path connecting the second control part and the memory in response to a control signal.

2. The semiconductor integrated circuit according to claim 1, wherein the memory and the selection part are disposed within the first region.

3. The semiconductor integrated circuit according to claim 2, wherein the first region other than the memory and the selection part is constituted by an element having a first threshold voltage, and the second region is constituted by an element having a second threshold voltage lower than the first threshold voltage.

4. The semiconductor integrated circuit according to claim 2, wherein the semiconductor integrated circuit operates in two modes: a normal mode in which power is supplied to an entirety of the semiconductor integrated circuit and a power saving mode in which power supply to the second region is cut off, and the selection part is constituted by a multiplexer, and the multiplexer selects the second path in the normal mode and selects the first path in the power saving mode.

5. The semiconductor integrated circuit according to claim 2, wherein the semiconductor integrated circuit operates in two modes: a normal mode in which power is supplied to an entirety of the semiconductor integrated circuit and a power saving mode in which power supply to the second region is cut off, and the selection part is constituted by an arbitration circuit, and the arbitration circuit selects the first path in accordance with access from the first control part and selects the second path in accordance with access from the second control part in the normal mode, and selects the first path in the power saving mode.

6. The semiconductor integrated circuit according to claim 1, wherein the memory and the selection part are disposed in a third region different from the first region and the second region.

7. The semiconductor integrated circuit according to claim 6, wherein the first region is constituted by an element having a first threshold voltage, and the second region is constituted by an element having a second threshold voltage lower than the first threshold voltage.

8. The semiconductor integrated circuit according to claim 7, wherein the third region other than the memory and the selection part is constituted by an element having the first threshold voltage.

9. The semiconductor integrated circuit according to claim 6, wherein the semiconductor integrated circuit operates in three modes: a normal mode in which power is supplied to an entirety of the semiconductor integrated circuit, a first power saving mode in which power supply to the second region is cut off, and a second power saving mode in which power supply to the first region is cut off, and the selection part is constituted by a multiplexer, and the multiplexer selects the second path in the normal mode and selects the first path in the first power saving mode, and selects the second path in the second power saving mode.

10. The semiconductor integrated circuit according to claim 6, wherein the semiconductor integrated circuit operates in three modes: a normal mode in which power is supplied to an entirety of the semiconductor integrated circuit, a first power saving mode in which power supply to the second region is cut off, and a second power saving mode in which power supply to the first region is cut off, and the selection part is constituted by an arbitration circuit, and the arbitration circuit selects the first path in accordance with access from the first control part and selects the second path in accordance with access from the second control part in the normal mode, the arbitration circuit selects the first path in the first power saving mode, and the arbitration circuit selects the second path in the second power saving mode.

11. The semiconductor integrated circuit according to claim 1, wherein the memory and the selection part are disposed within the first region.

12. The semiconductor integrated circuit according to claim 11, wherein the first region other than the memory and the selection part is constituted by an element having a first threshold voltage, and the second region is constituted by an element having a second threshold voltage lower than the first threshold voltage.

13. The semiconductor integrated circuit according to claim 3, wherein the semiconductor integrated circuit operates in two modes: a normal mode in which power is supplied to an entirety of the semiconductor integrated circuit and a power saving mode in which power supply to the second region is cut off, and the selection part is constituted by a multiplexer, and the multiplexer selects the second path in the normal mode and selects the first path in the power saving mode.

14. The semiconductor integrated circuit according to claim 3, wherein the semiconductor integrated circuit operates in two modes: a normal mode in which power is supplied to an entirety of the semiconductor integrated circuit and a power saving mode in which power supply to the second region is cut off, and the selection part is constituted by an arbitration circuit, and the arbitration circuit selects the first path in accordance with access from the first control part and selects the second path in accordance with access from the second control part in the normal mode, and selects the first path in the power saving mode.

15. The semiconductor integrated circuit according to claim 1, wherein the memory and the selection part are disposed in a third region different from the first region and the second region.

16. The semiconductor integrated circuit according to claim 15, wherein the first region is constituted by an element having a first threshold voltage, and the second region is constituted by an element having a second threshold voltage lower than the first threshold voltage.

17. The semiconductor integrated circuit according to claim 16, wherein the third region other than the memory and the selection part is constituted by an element having the first threshold voltage.

* * * * *